(12) United States Patent
Setlur et al.

(10) Patent No.: US 7,026,755 B2
(45) Date of Patent: Apr. 11, 2006

(54) DEEP RED PHOSPHOR FOR GENERAL ILLUMINATION APPLICATIONS

(75) Inventors: Anant Achyut Setlur, Niskayuna, NY (US); Alok Mani Srivastava, Niskayuna, NY (US); Holly Ann Comanzo, Niskayuna, NY (US)

(73) Assignee: General Electric Company, Schenectady, NJ (US)

( * ) Notice: Subject to any disclaimer, the term of this patent is extended or adjusted under 35 U.S.C. 154(b) by 209 days.

(21) Appl. No.: 10/636,016

(22) Filed: Aug. 7, 2003

(65) Prior Publication Data

US 2005/0029927 A1   Feb. 10, 2005

(51) Int. Cl.
*H01L 33/00* (2006.01)

(52) U.S. Cl. ............ 313/501; 313/503; 313/512; 257/89; 257/100; 445/23; 252/301.4 F

(58) Field of Classification Search ........... 257/79, 257/89, 98, 99, 100; 313/501–503, 412; 252/301.5, 301.6 R, 301.6 S, 301.6 P, 301.6 F, 252/301.4 S, 301.4 P, 301.4 F, 301.4 H; 445/23
See application file for complete search history.

(56) References Cited

U.S. PATENT DOCUMENTS

| | | | |
|---|---|---|---|
| 5,851,063 A | 12/1998 | Doughty et al. | |
| 5,998,925 A | 12/1999 | Shimizu et al. | |
| 6,013,199 A | 1/2000 | McFarland et al. | |
| 6,066,861 A | 5/2000 | Höhn et al. | |
| 6,069,440 A | 5/2000 | Shimizu et al. | |
| 6,084,250 A | 7/2000 | Jüstel et al. | |
| 6,096,243 A | 8/2000 | Oshio et al. | |
| 6,099,754 A * | 8/2000 | Yocom ............... | 252/301.4 F |
| 6,137,217 A | 10/2000 | Pappalardo et al. | |
| 6,203,726 B1 | 3/2001 | Danielson et al. | |
| 6,210,605 B1 | 4/2001 | Srivastava et al. | |
| 6,252,254 B1 | 6/2001 | Soules et al. | |
| 6,255,670 B1 | 7/2001 | Srivastava et al. | |
| 6,278,135 B1 | 8/2001 | Srivastava et al. | |
| 6,294,800 B1 | 9/2001 | Duggal et al. | |
| 6,340,824 B1 * | 1/2002 | Komoto et al. ............. | 257/99 |
| 6,351,069 B1 | 2/2002 | Lowery et al. | |
| 6,366,033 B1 | 4/2002 | Greci et al. | |
| 6,402,987 B1 | 6/2002 | Srivastava et al. | |
| 6,504,179 B1 | 1/2003 | Ellens et al. | |
| 6,513,949 B1 | 2/2003 | Marshall et al. | |
| 6,515,314 B1 | 2/2003 | Duggal et al. | |

(Continued)

FOREIGN PATENT DOCUMENTS

EP   1 193 306 A2   4/2002

(Continued)

OTHER PUBLICATIONS

Jong Su Kim, et al., "GaN-Based White-Light-Emitting Diodes Fabricated with a Mixture of $Ba_3MgSi_2O_8$: $EU^{2+}$ and $Sr_2SiO_4$: $EU^{2+}$ Phosphors", Japanese Journal of Applied Physics, vol. 43, No. 3, 2004, pp. 989-992.

*Primary Examiner*—Ashok Patel
(74) *Attorney, Agent, or Firm*—Fay, Sharpe, Fagan, Minnich & McKee, LLP

(57) ABSTRACT

A light emitting device including a UV semiconductor light source and a phosphor blend including a blue emitting phosphor, a green emitting phosphor and a deep red emitting phosphor comprising $(Ba,Sr,Ca)_3Mg_xSi_2O_8:Eu^{2+}$, $Mn^{2+}$, wherein $1 \leq x \leq 2$. Also disclosed is a phosphor blend comprising a blue emitting phosphor, a phosphor, a green emitting phosphor and a red emitting phosphor comprising $(Ba,Sr,Ca)_3Mg_xSi_2O_8:Eu^2$, $Mn^{2+}$.

20 Claims, 6 Drawing Sheets

U.S. PATENT DOCUMENTS

| | | |
|---|---|---|
| 6,521,915 B1 | 2/2003 | Odaki et al. |
| 6,522,065 B1 | 2/2003 | Srivastava et al. |
| 6,538,371 B1 | 3/2003 | Duggal et al. |
| 6,552,487 B1 | 4/2003 | Ellens et al. |
| 6,555,958 B1 | 4/2003 | Srivastava et al. |
| 6,576,931 B1 | 6/2003 | Furukawa et al. |
| 6,580,097 B1 | 6/2003 | Soules et al. |
| 6,592,780 B1 | 7/2003 | Höhn et al. |
| 6,596,195 B1 | 7/2003 | Srivastava et al. |
| 6,850,002 B1 * | 2/2005 | Danielson et al. .......... 313/501 |
| 2002/0063301 A1 * | 5/2002 | Hanamoto et al. .......... 257/432 |
| 2002/0105266 A1 | 8/2002 | Juestel et al. |
| 2004/0056256 A1 * | 3/2004 | Bokor et al. .................. 257/79 |

FOREIGN PATENT DOCUMENTS

| | | |
|---|---|---|
| WO | WO0189001 A2 * | 11/2001 |
| WO | WO0211214 A1 * | 2/2002 |

* cited by examiner

DEEP RED PHOSPHOR FOR GENERAL ILLUMINATION APPLICATIONS

BACKGROUND OF THE INVENTION

The present invention relates to phosphor compositions, particularly phosphors for use in lighting applications. More particularly, the present invention relates to a phosphor for converting UV light to red light for use in an LED or LCD and a lighting apparatus employing the same.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III–V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. By interposing a phosphor excited by the radiation generated by the LED, light of a different wavelength, e.g., in the visible range of the spectrum may be generated. Colored LEDs are often used in toys, indicator lights and other devices. These LEDs typically contain a UV emitting LED and a red, blue, green or other color emitting phosphor. Manufacturer's are continuously looking for new colored phosphors for use in such LEDs to produce custom colors and highly luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength at about 450 nm combined with a yellow light-emitting phosphor, such as cerium doped yttrium aluminum garnet $Y_3Al_5O_2:Ce^{3+}$ ("YAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light. Such a device, while suitable for limited applications, fails in applications where a true bright white light of high intensity and brightness is desired.

In addition to this somewhat limited emission intensity, the color output of such an LED-phosphor system varies greatly due to frequent, unavoidable routine deviations from desired parameters (i.e. manufacturing systemic errors) during the production of the light. For example, the color output of the finished device is very sensitive to the thickness of the phosphor layer covering the LED. If the phosphor is too thin, then more than a desired amount of the blue light emitted by the LED will penetrate through the phosphor and the combined phosphor-LED output will appear bluish. In contrast, if the phosphor layer is too thick, then less than a desired amount of the blue LED light will penetrate through the phosphor layer. In this case, the combined phosphor-LED output will appear yellowish. Therefore, the thickness of the phosphor layer is an important variable affecting the color output of a blue LED based system. Unfortunately, the thickness of the phosphor layer is difficult to control during large-scale production of LED-phosphor lamp systems, and the variations in phosphor thickness often result in relatively poor lamp to lamp color control. In addition, lamp to lamp variations occur due to the varying of the optical power from chip to chip.

The use of a UV LED chip to manufacture such a white-light system should give superior color performance compared to those based on blue LED chips since the UV chip is not appreciably contributing to the visible color of the LED. Recent advances, such as those disclosed in U.S. Pat. No. 6,255,670, are directed to the use of specific phosphor systems in conjunction with a UV emitting LED to emit white light. While effective, new phosphor combinations are needed to produce efficient white light with various spectral outputs to meet the needs of different market segments.

Particularly, phosphor blends utilizing deep red phosphors are desired to produce light sources having a high color rendering index (CRI). Two deep red phosphors currently being used in such applications are $(Ca,Sr)S:Eu^{2+}$ and $3.5MgO*0.5MgF_2*GeO_2:MN^{4+}$ (MFG). However, new deep red phosphors exhibiting stronger near-UV absorption and more flexible emission spectrums are currently being sought. Thus, a need exists for a new deep red phosphor emitting in the 620–700 nm range and displaying high quantum efficiency and strong absorption of UV radiation to produce both colored and white-light LEDs as well as for use in liquid crystal display (LCD) devices.

SUMMARY OF THE INVENTION

In a first aspect, the invention provides a white-light emitting device including a UV semiconductor light source having a peak emission from about 250 to about 430 nm and a phosphor blend including a blue emitting phosphor, a green emitting phosphor, and a deep red emitting phosphor comprising $(Ba,Sr,Ca)_3Mg_xSi_2O_8:Eu^{2+}$, $Mn^{2+}$, wherein $1 \leq x \leq 2$.

In a second aspect, the present invention provides a phosphor blend comprising a blue emitting phosphor, a green emitting phosphor, and a deep red emitting phosphor comprising $(Ba,Sr,Ca)_3MgSi_2O_8:Eu^{2+}$, $Mn^{2+}$, wherein $1 \leq x \leq 2$, and further wherein said phosphor blend is capable of producing white light when excited with UV radiation.

In a third aspect, the invention provides an illumination system including a UV semiconductor light source and a phosphor comprising $(Ba,Sr,Ca)_3MgSi_2O_8:Eu^{2+}$, $Mn^{2+}$, wherein $1 \leq x \leq 2$.

DETAILED DESCRIPTION OF THE INVENTION

Phosphors convert radiation (energy) to visible light. Different combinations of phosphors provide different colored light emissions. The colored light that originates from the phosphors provides a color temperature.

An ultraviolet (UV) conversion phosphor material (phosphor material) converts generated UV and near-UV radiation to visible light. The color of the generated visible light is dependent on the particular components of the phosphor material. The phosphor material may include only a single phosphor composition or two or more phosphors of basic color, for example a particular mix with one or more of a yellow and blue phosphor to emit a desired color (tint) of light. As used herein, phosphor material is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor blend including the individual phosphors convert radiation at a specified wavelength, for example radiation from about 250 to about 430 nm as emitted by a UV LED, into visible light. The visible light provided by the phosphor blend comprises a bright white light with high intensity and brightness.

Figure 1:
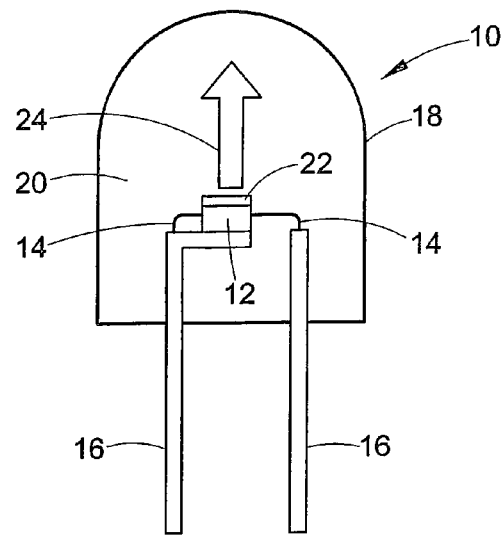
FIG. 1 is a schematic cross-sectional view of an illumination system in accordance with one embodiment of the present invention.

With reference to FIG. 1, an exemplary light emitting assembly or lamp 10 is shown in accordance with one embodiment of the present invention. The light emitting assembly 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor UV light source that is capable of producing white light when its emitted radiation is directed onto the phosphor. In a preferred embodiment, the semiconductor UV light source comprises a LED doped with various impurities. Thus, the LED may comprise a semiconductor diode based on any suitable III–V, II–VI or IV–IV semiconductor layers and having an emission wavelength of about 370 to 450 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+J+k=1$) having an emission wavelength greater than about 370 nm and less than about 450 nm. Preferably, the UV chip has a peak emission wavelength from about 400 to about 410 nm. Such LED semiconductors are known in the art. The radiation source is described herein as an LED for convenience. However, as used herein, the term is meant to encompass all semiconductor radiation sources including semiconductor laser diodes.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below. This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in one embodiment, the median particle size of the phosphor composition may be from about 1 to about 10 microns.

Figures 2, 3:
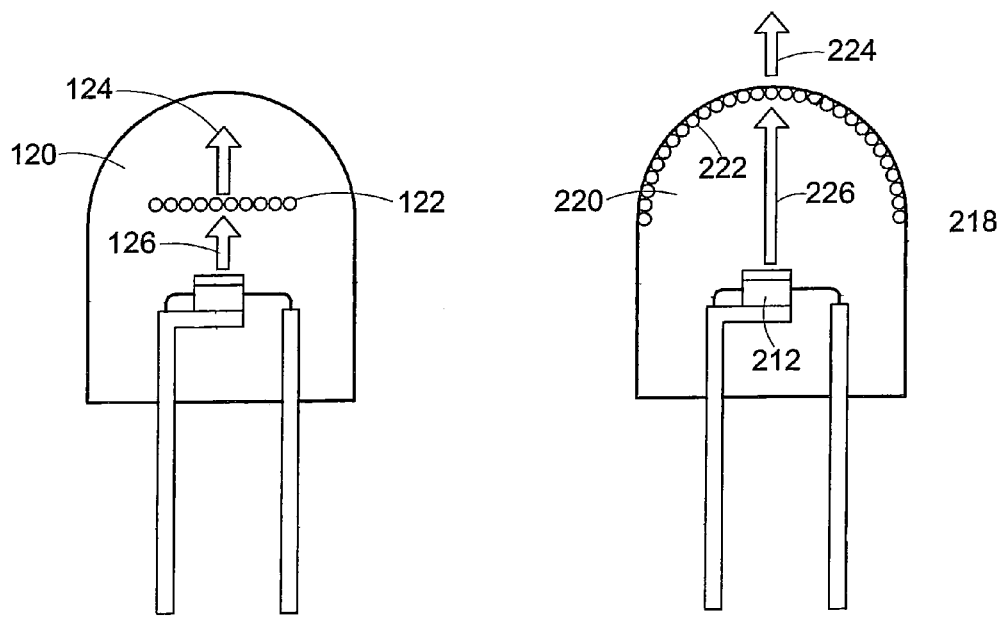
FIG. 2 is a schematic cross-sectional view of an illumination system in accordance with a second embodiment of the present invention.
FIG. 3 is a schematic cross-sectional view of an illumination system in accordance with a third embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. UV light 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

FIG. 3 illustrates a third preferred structure of the system according to the preferred aspects of the present invention. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The UV light 226 emitted by the LED chip 212 mixes with the light emitted by the phosphor composition 222, and the mixed light appears as white light 224. Of course, the embodiments of FIGS. 1–3 may be combined and the phosphor may be located in any two or all three locations or in any other suitable location, such as separately from the shell or integrated into the LED.

In any of the above embodiments, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption. The coupling of the diffuse scattered LED light with the phosphor is advantageous in reducing optical saturation effects and physical damage of the phosphor material.

Figure 4:
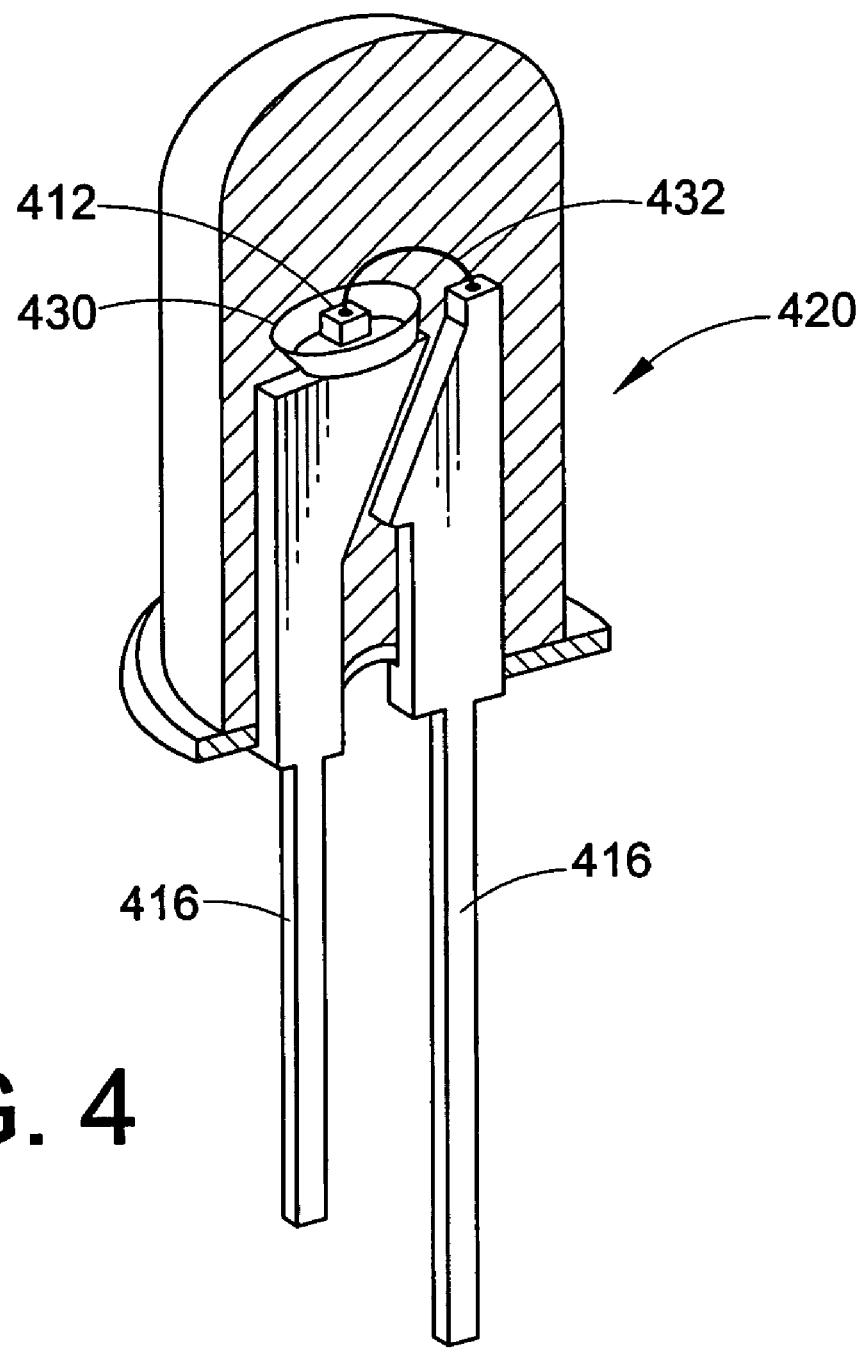
FIG. 4 is a cutaway side perspective view of an illumination system in accordance with a fourth embodiment of the present invention.

As shown in a fourth embodiment in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the phosphor composition 22 used in the invention is a composition having the general formula $(Ba,Sr,Ca)_3MgSi_2O_8:Eu^{2+}, Mn^{2+}$. The total doping levels of $Eu^{2+}$ and $Mn^{2+}$ can range from 0.1 to about 40%, with $Eu^{2+}$ ranging from about 0.1–40% and $Mn^{2+}$ ranging from 0.1 to 20%. In such an embodiment, the resulting lighting system will produce an light having a deep red color, the characteristics of which will be discussed in more detail below. Alternatively, an excess of $Mg^{2+}$ may be included in the phosphor to produce an "off-stoichiometry" phosphor having the formula $(Ba,Sr,Ca)_3Mg_xSi_2O_8:Eu^{2+}, Mn^{2+}$, wherein $1 \leq x \leq 2$. For convenience, when used herein, the formula $(Ba,Sr,Ca)_3MgSi_2O_8:Eu^{2+}, Mn^{2+}$ is intended to include these off-stoichiometry formulations as well unless stated otherwise.

In another embodiment, the phosphor composition 22 is a blend of three or more phosphors. When used in a lighting assembly in combination with a UV LED emitting radiation in the range of about 235 to 430 nm, the resultant light emitted by the assembly will be a white light. In one embodiment, the phosphor composition comprises a blend of at least one blue emitting phosphor, a green emitting phosphor, and a deep red phosphor having the general formula described above. The $(Ba,Sr,Ca)_3MgSi_2O_8:Eu^{2+}, Mn^{2+}$ phosphor for use in the phosphor composition may be produced by a method comprising the steps of: (1) providing stoichiometric (or an excess of Mg as detailed above for an off-stoichiometric phosphor composition) amounts of oxygen-containing compounds of Ba, Sr, and/or Ca; oxygen-containing compounds of Mg; and oxygen-containing compounds of Si; (2) mixing together the oxygen-containing compounds to form a mixture; and (3) firing the mixture in air or a reducing atmosphere at a temperature and for a time sufficient to convert the mixture to a cerium and terbium-activated phosphor having the above formula.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired under a reducing atmosphere at a temperature from about 900° C. to about 1700° C., preferably from about 1000° C. to about 1600° C., more preferably from about 1200° C. to about 1500° C. for a time sufficient to convert all of the mixture to the final composition. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide that is needed to provide the reducing atmosphere.

One or more of the starting materials for the phosphor synthesis may be oxygen-containing compounds other than oxides, such as nitrates, sulfates, acetates, citrates, carbonates, hydroxides, or oxalates of the metal constituents. These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1200–1600° C. for a sufficient time under a reducing atmosphere such as $H_2$, CO, or a mixture of one of theses gases with an inert gas, or an atmosphere generated by a reaction between a coconut charcoal and the products of the decomposition of the oxygen-containing compounds to covert all of the calcined material to the desired phosphor composition.

Figure 5:
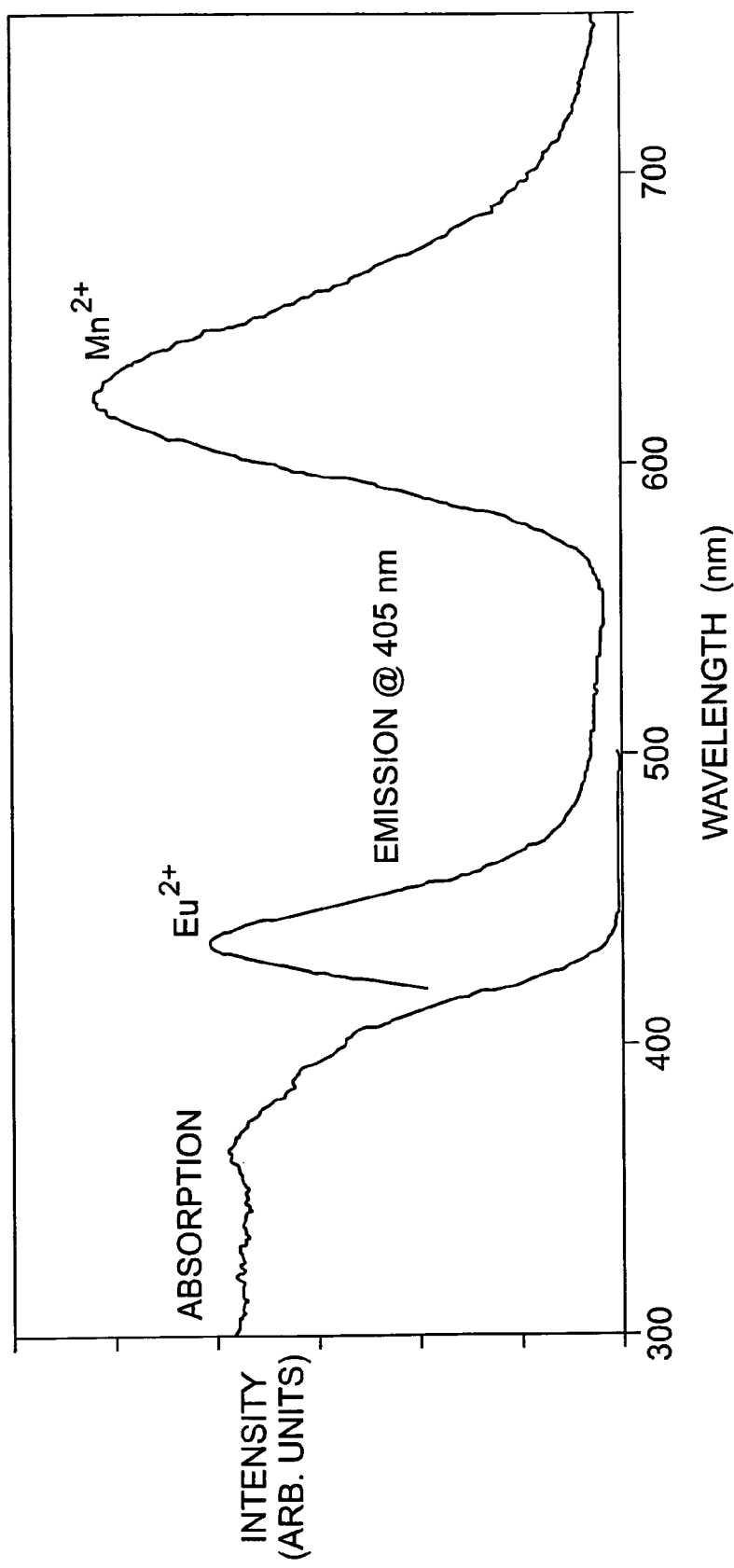
FIG. 5 is a graph of the absorption and emission spectra of $(Ba,Sr,Ca)_3MgSi_2O_8:Eu^{2+}$, $Mn^{2+}$.
Figure 6:
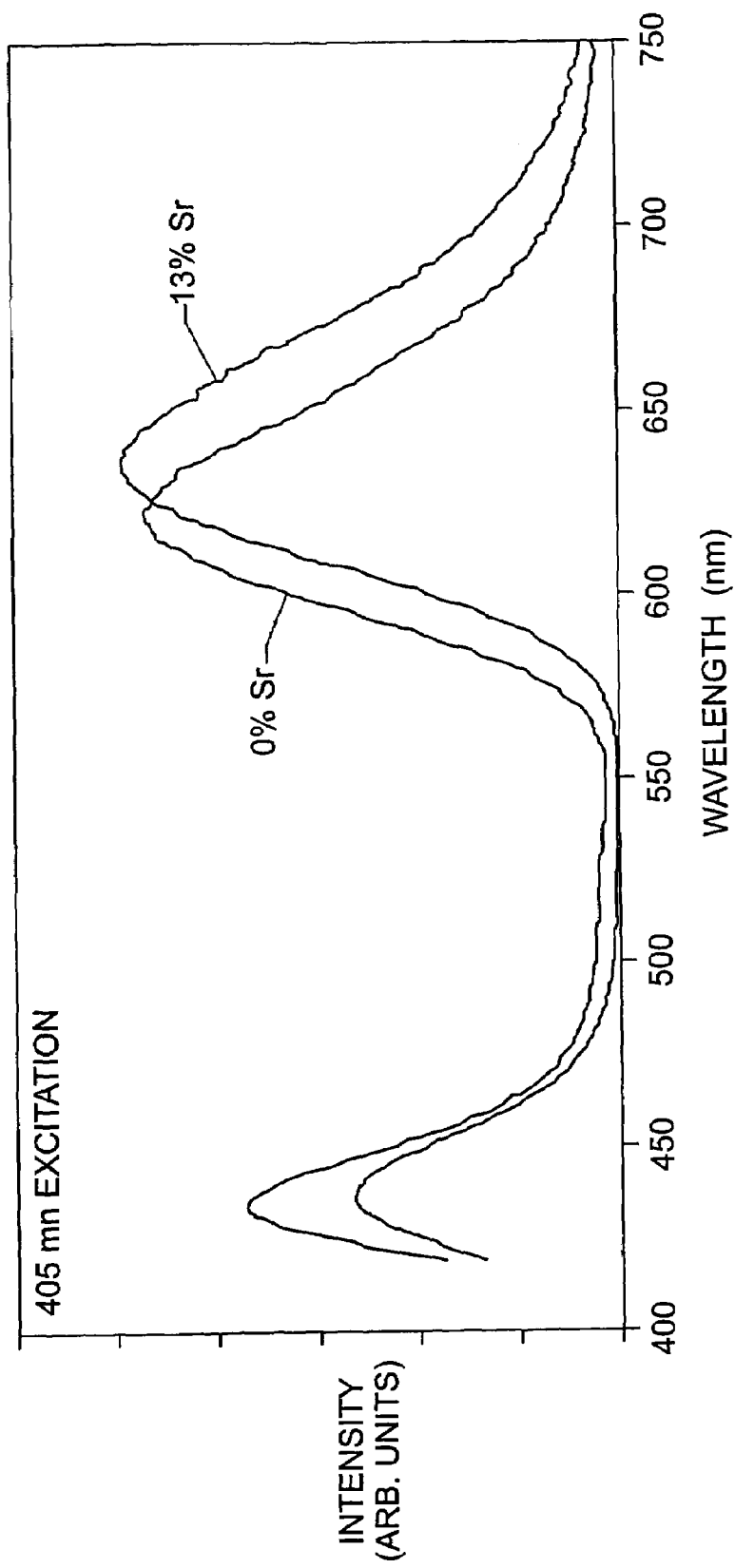
FIG. 6 is a graph of the emission spectrum of $(Ba,Sr,Ca)_3MgSi_2O_8:Eu^{2+}$, $Mn^{2+}$ for two different spectral concentrations of Sr.

FIG. 5 is a graph of the absorption and emission of $(Ba,Sr)_3MgSi_2O_8:Eu^{2+}, Mn^{2+}$. The emission spectrum used 405 nm light to excite the phosphor. The emission spectrum shows two emission peaks, the first at around 430–475 nm (corresponding to $Eu^{2+}$ emission) and the second at around 610–700 nm (corresponding to $Mn^{2+}$ emission). In addition to being quite efficient, this emission profile can be modified by varying the amount of Sr in the phosphor. Thus, as shown in FIG. 6, adding a greater percentage of Sr to the phosphor will shift the emission wavelength of the second emission peak to a longer wavelength. This results in a very versatile phosphor that can be used in a variety of applications by simply modifying the amount of individual components in the phosphor. This emission is quite preferred for generating red photons for use in deep red colored LEDs as well as the red component in a white light phosphor blend.

Figure 7:
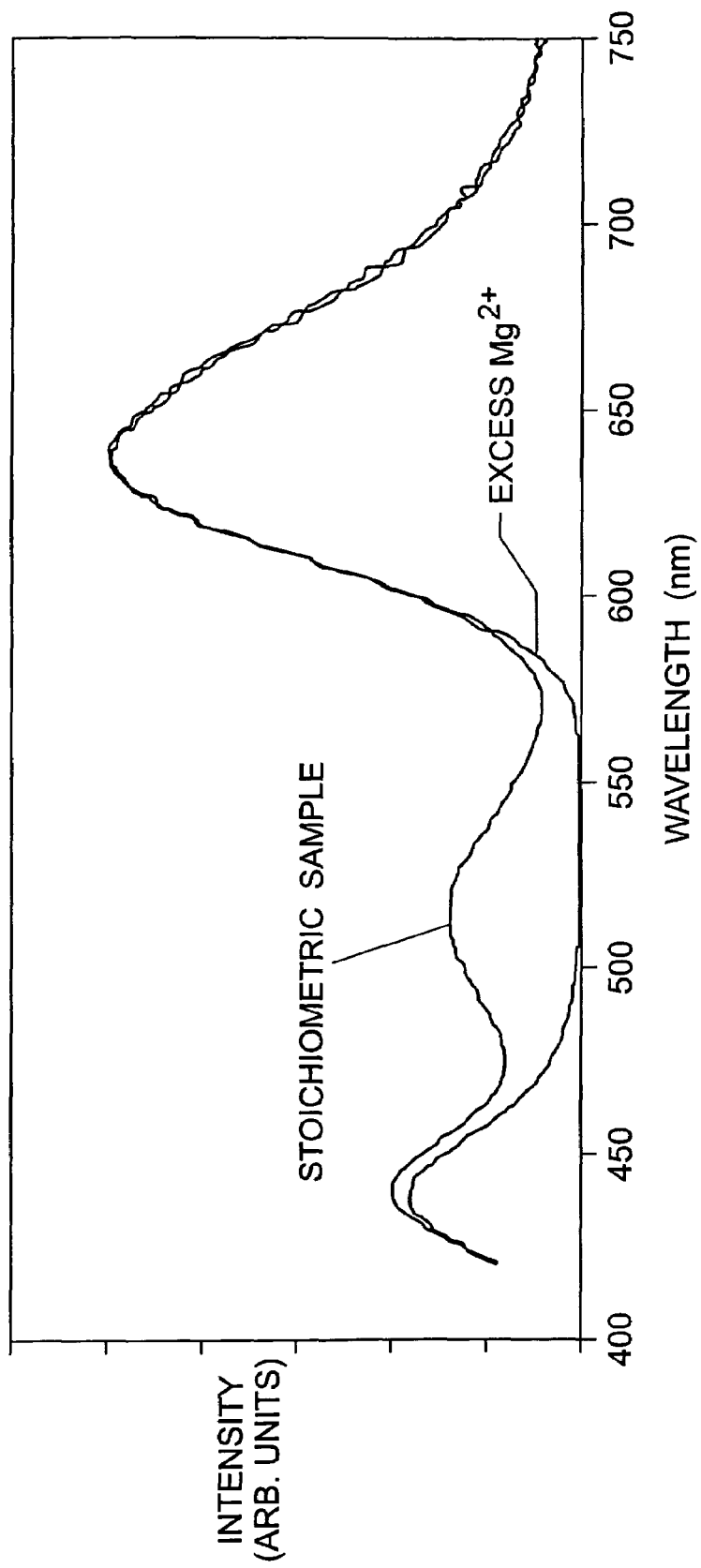
FIG. 7 is a graph of the emission spectrums of both stochiometric and excess Mg containing $(Ba,Sr,Ca)_3MgSi_2O_8:Eu^{2+}$, $Mn^{2+}$.

Similarly, as seen in FIG. 7, adding an excess of Mg, as described above, produces an emission spectrum have excellent phase purity as well as two distinct emission peaks, as compared to a stoichiometric sample, which produces an emission spectrum having additional minor emissions at intermediate wavelengths.

In a second embodiment, the phosphor composition includes a blend of the $(Ba,Sr,Ca)_3MgSi_2O_8:Eu^{2+}, Mn^{2+}$ phosphor described above and a green, blue and, optionally a blue-green, yellow-orange, and/or red emitting phosphor to create a white light emitting phosphor blend. Any known green and blue phosphor suitable for use in UV LED systems may be used. In addition to the green and blue phosphors, a yellow-orange and/or red phosphor may be used in the blend to customize the white color of the resulting light. Other blue-green, green, orange or additional phosphor may also be included based on the needs of the manufacturer. While not intended to be limiting, suitable phosphorfor use in the blend with the $(Ba,Sr,Ca)_3Mg_xSi_2O_8:Eu^{2+}, Mn^{2+}$ phosphor include:

Blue:
$(Ba,Sr,Ca)_5(PO_4)_3(Cl,F,Br,OH):Eu^{2+}, Mn^{2+}, Sb^{3+}$
$(Ba,Sr,Ca)MgAl_{10}O_{17}:Eu^{2+}, Mn^{2+}$
$(Ba,Sr,Ca)BPO_5:Eu^{2+}, Mn^{2+}$
$(Sr,Ca)_{10}(PO_4)_6*nB_2O_3:Eu^{2+}$
$2SrO*0.84P_2O_5*0.16B_2O_3:Eu^{2+}$
$Sr_2Si_3O_{8*}2SrCl_2:Eu^{2+}$
$Ba_3MgSi_2O_8:Eu^{2+}$
$Sr_4Al_{14}O_{25}:Eu^{2+}$ (SAE)
$BaAl_8O_{13}:Eu^{2+}$ Blue-Green:
$Sr_4Al_{14}O_{25}:Eu^{2+}$
$BaAl_8O_{13}:Eu^{2+}$
$2SrO-0.84P_2O_{5-0.16}B_2O_3:Eu^{2+}$
$MgWO_4$
$BaTiP_2O_8$
$(Ba,Sr,Ca)MgAl_{10}O_{17}:Eu^{2+}, Mn^{2+}$
$(Ba,Sr,Ca)_5(PO_4)_3(Cl,F,OH):Eu^{2+}, Mn^{2+}, Sb^{3+}$ Green:
$(Ba,Sr,Ca)MgAl_{10}O_17:Eu^{2+}, Mn^{2+}$ (BAMn)
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2:Eu^{2+}, Mn^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr, Lu)_3(Al,Ga)_5O_{12}:Ce^{3+}$
$(Ca,Sr)_8(Mg,Zn)(SiO_4)_4Cl_2:Eu^{2+}, Mn^{2+}$ (CASI)
$Na_2Gd_2B_2O_7:Ce^+, Tb^{3+}$
$(Ba,Sr)_2(Ca,Mg,Zn)B2O6:K,Ce,Tb$ Yellow-Orange:
$(Sr,Ca,Ba,Mg,Zn)_2P_2O_7:Eu^{2+}, Mn^{2+}$ (SPP);
$(Ca,Sr,Ba,Mg)_{10}(PO_4)_6(F,Cl,Br,OH):Eu^{2+}, Mn^{2+}$ (HALO);

Red:
$(Gd,Y,Lu,La)_2O_3:Eu^{3+}, Bi^{3+}$
$(Gd,Y,Lu,La)_2O_2S:Eu^{3+}, Bi^{3+}$
$(Gd,Y,Lu,La)VO_4:Eu^{3+}, Bi^{3+}$
$(Ca,Sr)S:Eu^{2+}$
$SrY_2S_4:Eu^{2+}$
$CaLa_2S_4:Ce^{3+}$
$(Ca,Sr)S:Eu^{2+}$
$3.5MgO*0.5MgF_2*GeO_2:Mn^{4+}$ (MFG)
$(Ba,Sr,Ca)MgP_2O_7:Eu_{2+}, Mn_{2+}$
$(Y,Lu)_2WO_6:Eu^3+, Mo^{6+}$

Orange:
$(Y,In,Gd,La,Lu,Sc)BO_3:Eu^{3+}$
$YVO_4:Dy^{3+}$
$GdMgB_5O_{10}:Ce^{3+}, Dy^{3+}$
$(Tb,Y,Lu,La,Gd)_3(Al,Ga)_5O_{12}:Ce^{3+}$
$(Ba,Sr,Ca)_5(PO_4)_3(Cl,F,OH):Eu^{2+}, Mn^{2+}, Sb^{3+}$
$(Sr,Ba)GdB_8O_{16}:Eu^{3+}$ The weight ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.45, and a y value in the range of about 0.30 to about 0.45.

The relative amounts of each phosphor in the phosphor composition can be described in terms of spectral weight. The spectral weight is the relative amount that each phosphor contributes to the overall emission spectra of the phosphor blend when excited by UV light. The spectral weight amounts of all the individual phosphors should add up to 1. Although not intended to be limiting, the phosphor composition of the present invention may generally contain, in spectral weight amounts, about 0.01–0.3 of a blue phosphor, about 0.1–0.5 of a green phosphor, and the balance including the red $(Ba,Sr,Ca)_3MgSi_2O_8:Eu^{2+}, Mn^{2+}$ phosphor and, optionally, a yellow-orange phosphor and/or an additional red phosphor. As stated, however the exact identity and amounts of each phosphor in the phosphor composition can be varied according to the needs of the end user.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

Figure 8:
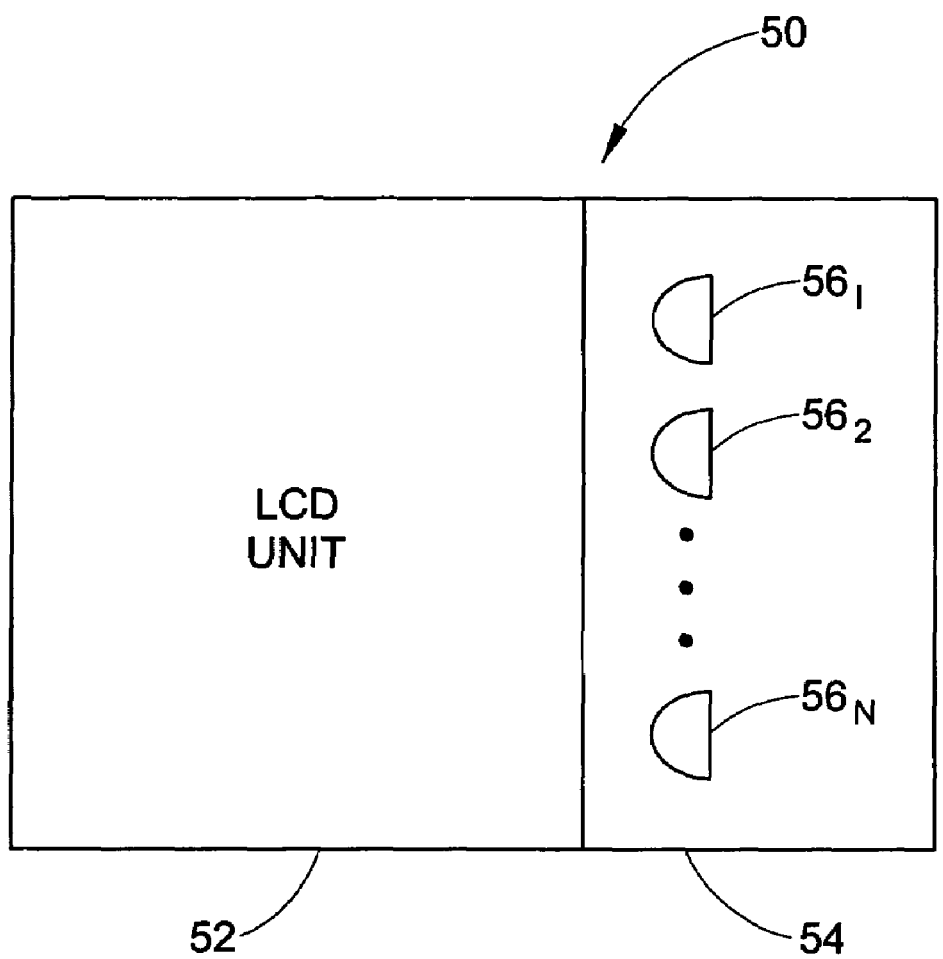
FIG. 8 is a view of an LCD unit and an LED-based backlighting system therefore.

For example, in another embodiment, the $(Ba,Sr,Ca)_3MgSi_2O_8:Eu^{2+}, Mn^{2+}$ phosphor can be used to generate red photons in an LCD backlight phosphor blend. FIG. 8 shows a system 50 for back-lighting a LCD unit via a mixture of saturated LEDs. FIG. 8 shows a side elevational view of an LCD unit 52 including a back-lighting unit 54 having a number, N, of saturated LEDs $56_1$–$56_N$ suitably mounted to emit radiation toward a back panel of LCD unit 52. In system 50, the LEDs LEDs $56_1$–$56_N$ may, for example, be chosen to be two groups of LEDs each emitting different saturated colors. The $(Ba,Sr,Ca)_3MgSi_2O_8:Eu^{2+}, Mn_{2+}$ phosphor may be used to emit the red color for the backlight. The two colors are typically chosen so that they lie on a line on the CIE chromaticity diagram that contains therebetween the coordinates of the target color.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a semiconductor light source emitting radiation having a wavelength in the range of from about 235 to about 430 nm;
   a phosphor composition radiationally coupled to the semiconductor light source, the phosphor composition comprising a blue emitting phosphor, a green emitting phosphor and a red emitting phosphor comprising $(Ba,Sr,Ca)_3Mg_xSi_2O_8:Eu^{2+}, Mn^{2+}$, wherein $1<x\leq 2$.

2. The lighting apparatus of claim 1, wherein the semiconductor light source is a light emitting diode (LED).

3. The lighting apparatus of claim 2, wherein the LED comprises a nitride compound semiconductor represented by the formula $In_iGa_jAl_kN$, where $0\leq i$; $0\leq j$, $0\leq k$, and $i+j+k=1$.

4. The lighting apparatus of claim 1, wherein the phosphor composition is coated on the surface of the semiconductor light source.

5. The lighting apparatus of claim 1, further comprising an encapsulant surrounding the semiconductor light source and the phosphor composition.

6. The lighting apparatus of claim 1, wherein the phosphor composition is dispersed in the encapsulant.

7. The lighting apparatus of claim 1, further comprising a reflector cup.

8. The lighting apparatus of claim 1, wherein said phosphor composition further comprises at least one of a blue-green emitting phosphor, an yellow-orange emitting phosphor, and an additional red emitting phosphor.

9. The lighting apparatus of claim 1, wherein said phosphor composition comprises a spectral weight of 0.01–0.3 of the blue phosphor, about 0.1–0.5 of the green phosphor, and the balance of the red phosphor.

10. The lighting apparatus of claim 1, wherein said blue emitting phosphor is selected from the group consisting of $(Ba,Sr,Ca)_5(PO_4)_3(Cl,F,Br,OH):Eu^{2+}, Mn^{2+}$; $Sb^{3+}$,$(Ba,Sr,Ca)MgAl_{10}O_{17}:Eu^{2+}, Mn^{2+}$; $(Ba,Sr,Ca)BPO_5:Eu^{2+}, Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $(Ba,Sr,Ca)Mg_xP_2O_7:Eu^{2+}, Mn^{2+}$; $Sr_4Al_{14}O_{25}:Eu^{2+}$ (SAE); $BaAl_8O_{13}:Eu^{2+}$; and mixtures thereof.

11. The lighting apparatus of claim 8, wherein said red phosphor is selected from the group consisting of $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}, Mn^{2+}$; $(Y,Lu)_2WO_6:Eu^{3+}, Mo^{6+}$; and mixtures thereof.

12. The lighting apparatus of claim 1, wherein said green phosphor is selected from the group consisting of $(Ba,Sr,Ca)MgAl_{10}O_17:Eu^{2+}, Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}, Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}, Mn^{2+}$ (CASI); $Na_2Gd_2B_2O_7:Ce^{3+}, Tb^{3+}$; $(Ba,Sr)2(Ca,Mg,Zn)B2O6:K,Ce,Tb$; and mixtures thereof.

13. The lighting apparatus of claim 1, wherein said $(Ba,Sr,Ca)_3Mg_xSi_2O_8:Eu^{2+}, Mn^{2+}$ phosphor emits radiation having a first emission peak at about 430 to about 475 nm and a second emission peak at around 610 to 700 nm.

14. The lighting apparatus of claim 1, wherein said $(Ba,Sr,Ca)_3Mg_xSi_2O_8:Eu^{2+}, Mn^{2+}$ phosphor contains a greater amount of Sr than Ba or Ca.

15. The lighting apparatus of claim 1, wherein the total combined doping levels of $Eu^{2+}$ and $Mn^{2+}$ in the $(Ba,Sr,Ca)_3Mg_xSi_2O_8:Eu^{2+}, Mn^{2+}$ phosphor is from 0.1% to 40% by weight of the total phosphor composition.

16. A lighting apparatus for emitting light comprising:
    a semiconductor light source emitting radiation having a wavelength in the range of from about 235 to about 430 nm;
    a phosphor composition radiationally coupled to the semiconductor light source, the phosphor composition comprising a red emitting phosphor comprising $(Ba,Sr,Ca)_3Mg_xSi_2O_8:Eu^{2+}, Mn^{2+}$, wherein $1<x\leq 2$.

17. A lighting apparatus for emitting light according to claim 16, wherein said $(Ba,Sr,Ca)_3Mg_xSi_2O_8:Eu^{2+}, Mn^{2+}$ phosphor emits radiation having a first emission peak at about 430 to about 475 nm and a second emission peak at around 610 to 700 nm.

18. A method for forming a lighting apparatus, the method comprising the steps of:
    providing a near UV LED capable of emitting radiation having a wavelength of from about 235 to about 430 nm; and,
    radiationally coupling a phosphor composition to the LED, the phosphor composition comprising a blue emitting phosphor, a green emitting phosphor and a red emitting phosphor comprising $(Ba,Sr,Ca)_3Mg_xSi_2O_8$:$Eu^{2+}$, $Mn^{2+}$, wherein $1<x\leq2$;

wherein the phosphor composition is capable of absorbing the radiation emitted by the semiconductor light source and converting the radiation into white light.

19. A phosphor blend comprising a blue emitting phosphor, a green emitting phosphor and a red emitting phosphor comprising $(Ba,Sr,Ca)_3Mg_xSi_2O_8$:$Eu^{2+}$, $Mn^{2+}$, wherein $1<x\leq2$.

20. The phosphor blend of claim 19, wherein said phosphor blend is capable of absorbing the radiation emitted by a semiconductor light source emitting from 235–430 nm and converting the radiation into white light.

* * * * *